United States Patent [19]
Wronski

[11] Patent Number: 5,982,634
[45] Date of Patent: Nov. 9, 1999

[54] HIGH SPEED SWITCH PACKAGE PROVIDES REDUCED PATH LENGTHS FOR ELECTRICAL PATHS THROUGH THE PACKAGE

[75] Inventor: Leszek Dariusz Wronski, Dayton, Ohio

[73] Assignee: Systran Corporation, Dayton, Ohio

[21] Appl. No.: 08/749,094

[22] Filed: Nov. 14, 1996

[51] Int. Cl.$^6$ ................................................. G06F 13/121
[52] U.S. Cl. ........................... 361/788; 710/126; 710/131
[58] Field of Search .................................... 395/800, 306; 361/788, 735, 777, 803; 710/1, 126, 131

[56] References Cited

U.S. PATENT DOCUMENTS

| | | |
|---|---|---|
| 4,736,124 | 4/1988 | McFarland, Jr. . |
| 4,947,288 | 8/1990 | Olsson ..................................... 361/413 |
| 4,975,695 | 12/1990 | Almond et al. . |
| 5,119,273 | 6/1992 | Corda . |
| 5,428,806 | 6/1995 | Pocrass . |
| 5,446,621 | 8/1995 | Jansen et al. . |
| 5,488,541 | 1/1996 | Mistry et al. . |
| 5,530,811 | 6/1996 | Benton et al. ........................... 395/306 |
| 5,568,361 | 10/1996 | Ward et al. .............................. 361/735 |
| 5,603,044 | 2/1997 | Annapareddy et al. ................. 395/800 |
| 5,696,667 | 12/1997 | Berding ................................... 361/788 |

FOREIGN PATENT DOCUMENTS

| | | |
|---|---|---|
| 0 359 086 A2 | 3/1990 | European Pat. Off. . |
| 0 488 057 A1 | 6/1992 | European Pat. Off. . |
| 0 726 528 A1 | 8/1996 | European Pat. Off. . |

*Primary Examiner*—Thomas C. Lee
*Assistant Examiner*—Abdelmoniem L. Elamin
*Attorney, Agent, or Firm*—Killworth, Gottman, Hagan & Schaeff, LLP

[57] ABSTRACT

A compact, high speed switch packaging arrangement or package provides reduced path lengths for electrical paths through the package. In particular, a printed circuit board switch backplane supports a switching subsystem and connects the switching subsystem to pairs of electrical connectors with the pairs of connectors being positioned on opposite edges of the same side of the backplane. A plurality of port boards for processing signals to be switched by the switching subsystem each include pairs of connectors which intermate with the pairs of connectors on the backplane. Port circuitry on the port boards is connected to the port board connectors to minimize trace lengths on the port boards by routing ports to the nearest one of the two connectors. The port boards are mounted to the backplane such that signals from the port boards are routed to the switching subsystem from two opposite sides of the switching subsystem. This routing results in a star or radiating pattern of trace paths on the backplane to reduce trace lengths. Further, since the connectors on the backplane are placed on opposite sides of the switching subsystem, the port boards coupled with the connectors can extend over and above that portion of the backplane which supports the switching subsystem thereby placing the connectors as close as possible to the switching subsystem and, in turn, further reducing trace lengths on the backplane.

20 Claims, 3 Drawing Sheets

HIGH SPEED SWITCH PACKAGE PROVIDES REDUCED PATH LENGTHS FOR ELECTRICAL PATHS THROUGH THE PACKAGE

BACKGROUND OF THE INVENTION

The present invention relates in general to digital data switches and, more particularly, to a compact package for digital data switches operating with digital data signals up to and including gigabit and higher speed signals.

Packaging of digital data switches is an ongoing problem due, at least in part, to the electrical characteristics of the packaging materials which are used to mount a switch and associated control elements for the switch and to conduct data signals to and from the switch. For example, a digital data switch, typically one or more integrated circuit chips, is mounted on a printed circuit board (PCB) with electrically conducting traces formed on the switch board to conduct signals to and from the switch on the board. These traces present an impedance to signals which attenuate and can distort the signals. For high speed signals, the impedance and resulting attenuation and distortion can vary widely due to minor variations in the traces making signal retrieval difficult. Signals are also cross coupled among the traces and can be radiated from the traces leading to cross-talk among the signals and electromagnetic radiation or electromagnetic interference (EMI) which can cause operating problems for the switch and also for other nearby equipment.

In addition to the challenges presented by the switch board, signals to be switched are normally processed on secondary boards, for example port boards, which are commonly interconnected to the switch board by intermating electrical connectors. Even the best pairs of electrical connectors present an impedance mismatch when a port board connector is intermated with a switch board connector. As with trace impedances, connector impedance mismatches have significant effect on the attenuation and distortion of signals, particularly high speed signals.

Various approaches have been used in packaging high speed digital data switches. For example, attempts have been made to package the switch, associated switch circuitry and a plurality of port circuits on a common printed circuit board. While eliminating the expense and problems resulting from connectors, unfortunately such packaging results in very large boards with correspondingly long traces. These single board systems are difficult to maintain and are not well adapted to upgrades, particularly for the port circuitry.

In other configurations, port boards have been interconnected to both the front and back sides of a switch board. Unfortunately, such arrangements are more complex and result in larger switch package sizes.

In still other configurations, the port boards are reduced in size. While such reduced size port boards can result in compaction of a switch, for a switch accommodating a large number of ports, the trace lengths on the switch board still present a problem.

Accordingly, there is an ongoing need for improved packaging arrangements for high speed digital data switches operating with signals up to and including gigabit and higher speed signals. Preferably, such arrangements would be easily maintained and upgraded.

SUMMARY OF THE INVENTION

The invention of the present application meets this need by providing a compact, high speed switching packaging arrangement or package which provides reduced lengths for electrical paths through the package. In particular, a switch backplane, typically a printed circuit board, supports a switching subsystem and connects the switching subsystem to pairs of electrical connectors with the pairs of connectors being positioned on opposite edges of the same side of the backplane. Each of a plurality of port boards for processing signals to be switched by the switching subsystem includes pairs of connectors which intermate with the pairs of connectors on the backplane. Port circuitry on the port boards is connected to the port board connectors to minimize electrical path lengths on the port boards by routing connecting paths to the nearest one of the two connectors. The port boards are mounted to the backplane such that signals from the port boards are routed to the switching subsystem from two opposite sides of the switching subsystem. This routing results in a star or radiating pattern of paths on the backplane to reduce path lengths. Further, since the connectors on the backplane are placed on opposite sides of the switching subsystem, port boards coupled to the backplane connectors can extend over and above that portion of the backplane which supports the switching subsystem thereby placing the connectors on the backplane as close as possible to the switching subsystem and, in turn, further reducing path lengths on the backplane.

According to a first aspect of the present invention, a high speed switch packaging arrangement includes a backplane having first, second, third and fourth ends. The first and second ends are opposite one another and the third and fourth ends are opposite one another. A plurality of first connectors are disposed along the first end of the backplane and a plurality of second connectors are disposed along the second end of the backplane. The second connectors are aligned with the first connectors to define corresponding pairs of first and second connectors. A switching subsystem is disposed between the first connectors and the second connectors on the backplane which provides a plurality of electrical connections between the switching subsystem and the first and second connectors. The packaging arrangement also includes a plurality of interface cards. Each of the interface cards includes a third connector and a fourth connector with each corresponding pair of the first and second connectors receiving the third and fourth connectors of respective interface cards to connect the interface cards to the backplane.

The plurality of electrical connections may include at least one input connection and at least one output connection for each of the plurality of first and second connectors. Each of the interface cards preferably includes at least one input/output (I/O) port associated with each of the third and fourth connectors. The first connectors and the second connectors may be disposed on a first side of the backplane and the switching subsystem may be disposed on a second side of the backplane with at least one of the interface cards extending over that portion of the backplane which supports the switching subsystem.

Preferably, the plurality of electrical connections include a plurality of input connections and a plurality of output connections for each of the plurality of first and second connectors. Further, each of the interface cards preferably includes a plurality of I/O ports associated with the third and fourth connectors. The plurality of I/O ports may include a first and second I/O port associated with the third connector and a third and fourth I/O port associated with the fourth connector. Each of the first, second, third and fourth connectors may include a plurality of unused connection pins.

The I/O ports may be disposed along first ends of the interface cards and the third and fourth connectors are then disposed along second ends of the interface cards. Each of the interface cards may include a plurality of printed circuit board traces disposed on the interface card. The printed circuit board traces connect each of the I/O ports with the third and fourth connectors so that traces from each of the I/O ports which cross traces from other I/O ports are reduced to a minimum and preferably zero. In the illustrated embodiment, the plurality of electrical connections are printed circuit board traces. The switching system comprises at least one integrated circuit chip. In a working embodiment, a single integrated circuit chip comprising a 32 channel switch was used, the plurality of first and second connectors form 8 corresponding pairs of connectors, and each of the interface cards includes 4 I/O ports.

According to another aspect of the present invention, a high speed switch packaging arrangement includes a backplane having a first side, a second side, a first end, and a second end. The backplane includes a plurality of printed circuit board traces disposed on the backplane. The packaging arrangement further includes a plurality of first connectors disposed along the first end on the first side of the backplane and a plurality of second connectors disposed along the second end on the first side of the backplane. The second connectors are aligned with the plurality of first connectors forming corresponding pairs of first and second connectors. A switching subsystem is disposed on the backplane between the plurality of first and second connectors. Printed circuit board traces connect the switching subsystem with the plurality of first and second connectors. The packaging arrangement further includes a plurality of interface cards each having a third connector and a fourth connector with each corresponding pair of the first and second connectors receiving the third and fourth connectors of respective interface cards to connect the interface cards to the backplane. At least one of the interface cards extends over a portion of the backplane which supports the switching subsystem, and each of the interface cards includes at least one I/O port associated with the third connector and at least one I/O port associated with the fourth connector.

Preferably, the plurality of printed circuit board traces include a plurality of input connections and a plurality of output connections for each of the plurality of first and second connectors. Each of the interface cards may include a first and second I/O port associated with the third connector and a third and fourth I/O port associated with the fourth connector. Preferably, the I/O ports are disposed along a first end of each of the interface cards and the third and fourth connectors are disposed along a second end of each of the interface cards. Each of the interface cards includes a plurality of printed circuit board traces disposed thereon which connect each of the I/O ports with respective third and fourth connectors, so that traces from each of the I/O ports which cross traces from other I/O ports are reduced to a minimum and preferably zero.

In a working embodiment, the switching subsystem includes one integrated circuit chip having connection pins disposed along first and second sides opposing one another and third and fourth sides opposing one another. The plurality of output connections include a first plurality of output connections connecting the plurality of first connectors to the connection pins primarily along the first side of the integrated circuit chip and a second plurality of output connections connecting the plurality of second connectors to the connection pins primarily along the second side of the one integrated circuit chip. The plurality of input connections include a first plurality of input connections connecting the plurality of first connectors to the connection pins primarily along a first portion of the third and fourth sides of the one integrated circuit chip and a second plurality of input connections connecting the plurality of second connectors to connection pins primarily along a second portion of the third and fourth sides of the integrated circuit chip.

The first and second plurality of output connections are arranged so that the output connections from each connector which cross output connections from other connectors is reduced preferably to zero, and the first and second plurality of input connections are arranged so that the input connections from each connector which cross input connections from other connectors is reduced preferably to zero. Each of the first, second, third and fourth connectors may include a plurality of unused connection pins. In a working embodiment, the integrated circuit chip comprises a 32 channel switching integrated circuit chip and the plurality of first and second connectors form 8 corresponding pairs of connectors.

According to yet another aspect of the present invention, a high speed switch packaging arrangement includes a backplane having first and second ends opposing one another, third and fourth ends opposing one another, a first side and a second side. A switching subsystem is disposed on the backplane and generally centered between the first, second, third and fourth ends of the backplane. A plurality of first connectors disposed on the first side of the backplane and on one side of an axis defined by a first side of the switching subsystem. A plurality of second connectors is disposed on the first side of the backplane and on one side of an axis defined by a second side of the switching subsystem. The first and second connectors form corresponding pairs of first and second connectors. A plurality of printed circuit board traces on the backplane connect the switching subsystem with the plurality of first and second connectors. A plurality of interface cards each having a third connector and a fourth connector with each corresponding pair of the first and second connectors receiving the third and fourth connectors of respective interface cards to connect the interface cards to the backplane. At least one of the interface cards extends over a portion of the backplane including the switching subsystem, and each of the interface cards includes at least one I/O port associated with the third connector and at least one I/O port associated with the fourth connector.

Other objects and advantages of the invention will be apparent from the following description, the accompanying drawings and the appended claims.

DETAILED DESCRIPTION OF THE INVENTION

Figure 1:
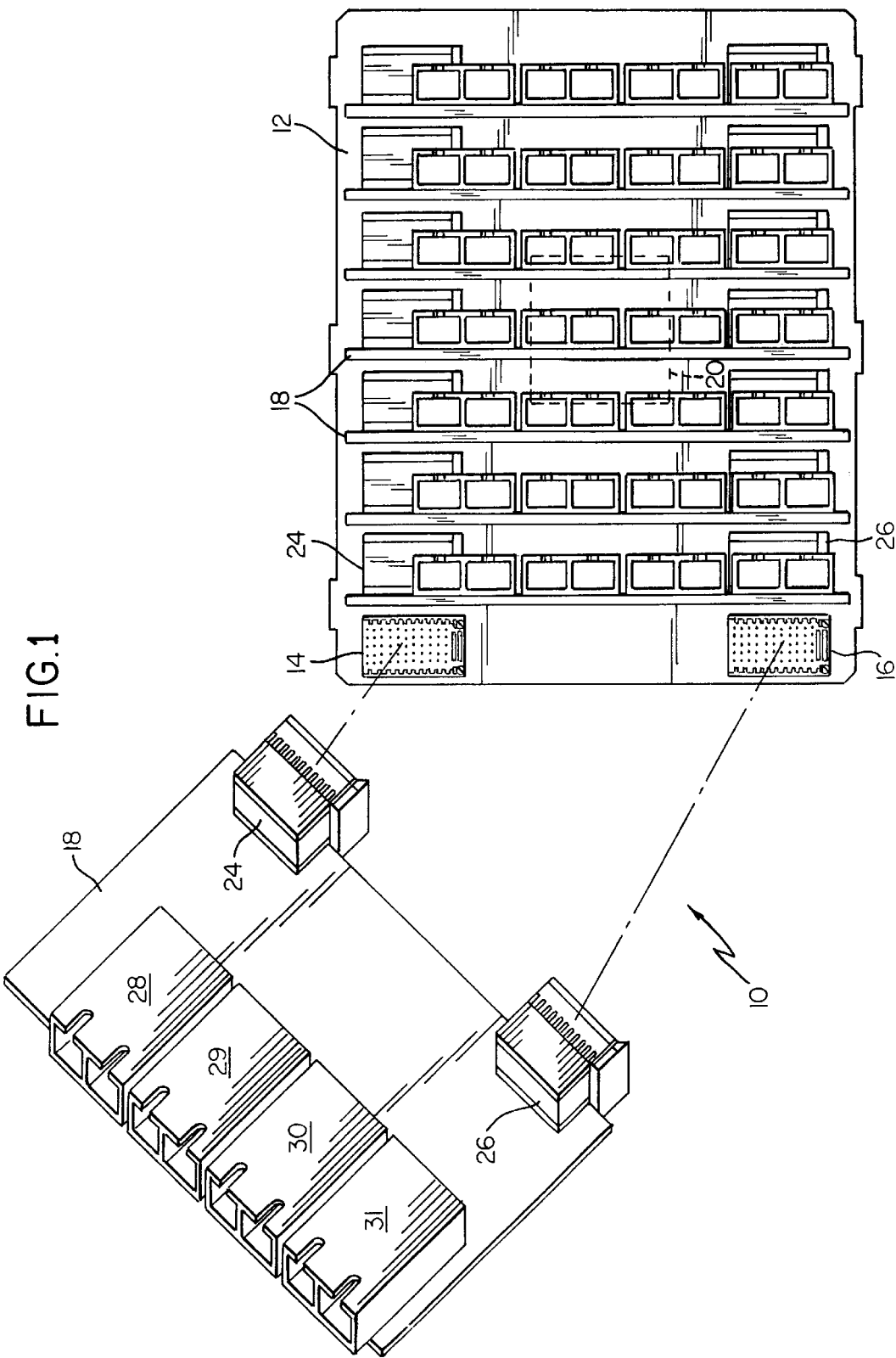
FIG. 1 is a perspective view of a high speed switch packaging arrangement of the present invention.
Figure 2:
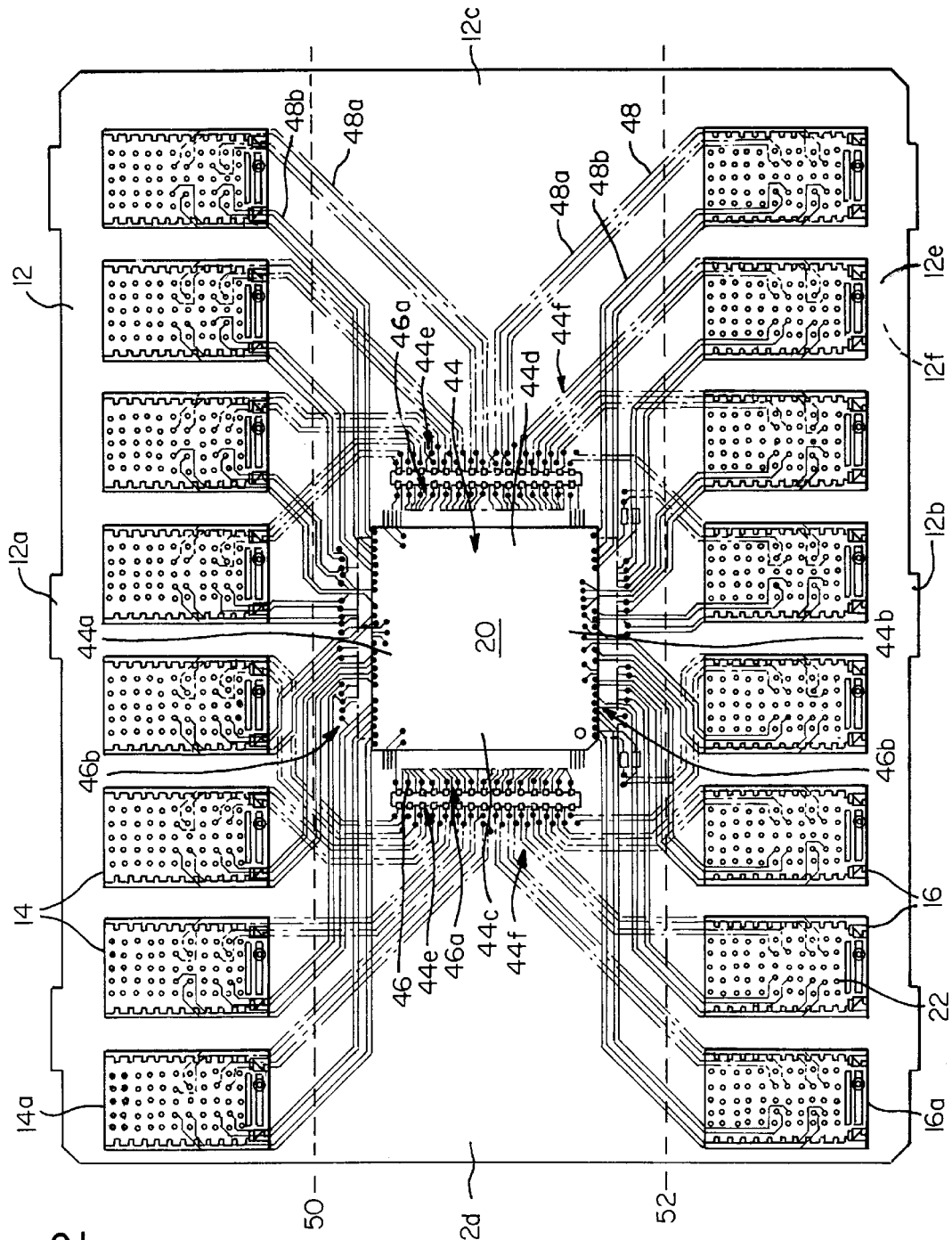
FIG. 2 is a plan view of a backplane of the packaging arrangement of FIG. 1.

Referring now to FIG. 1, a high speed switch packaging arrangement 10 is shown. The high speed switch packaging arrangement 10 includes a backplane 12, a plurality of first connectors 14 (only one shown), a plurality of second connectors 16 (only one shown), a plurality of interface cards 18, and a switching subsystem 20 comprising one or more integrated circuits and support circuitry as required. As shown in FIG. 2, the backplane 12 is generally rectangular in shape; however, other shapes such as a hexagon, an octagon or other appropriate shapes can be used for a given application and generally rectangular should be understood to include backplanes where portions of the backplane may be cut out, off the edges or the like. The backplane 12 has a first end 12a, a second end 12b, a third end 12c, a fourth end 12d, a first side 12e and a second side 12f. The first and second ends 12a, 12b are opposite each other, and the third and fourth ends 12c, 12d are opposite each other. The backplane 12 is preferably a printed circuit board (PCB) constructed using standard PCB technology.

The plurality of first connectors 14 are disposed along the first end 12a of the backplane 12 while the plurality of second connectors 16 are disposed along the second end 12b of the backplane 12. The first and second connectors 14, 16 are mounted to the first side 12e of the backplane 12 in a conventional manner. The first and second connectors 14, 16 are illustrated as being male portions of standard connector pairs and each includes a plurality of pins 22.

The first and second connectors 14, 16 are aligned with each other to form corresponding pairs of connectors. For example, a first connector 14a is aligned with and spaced a predetermined distance from a second connector 16a so as to receive connectors from a corresponding one of the plurality of interface cards 18. While the first connectors 14 and the second connectors 16 are illustrated as being lined up along the first end 12a and second end 12b of the backplane 12, respectively, they do not need to be in lines provided corresponding pairs of the connectors 14, 16 are properly spaced relative to one another to receive the interface cards 18.

Figure 3:
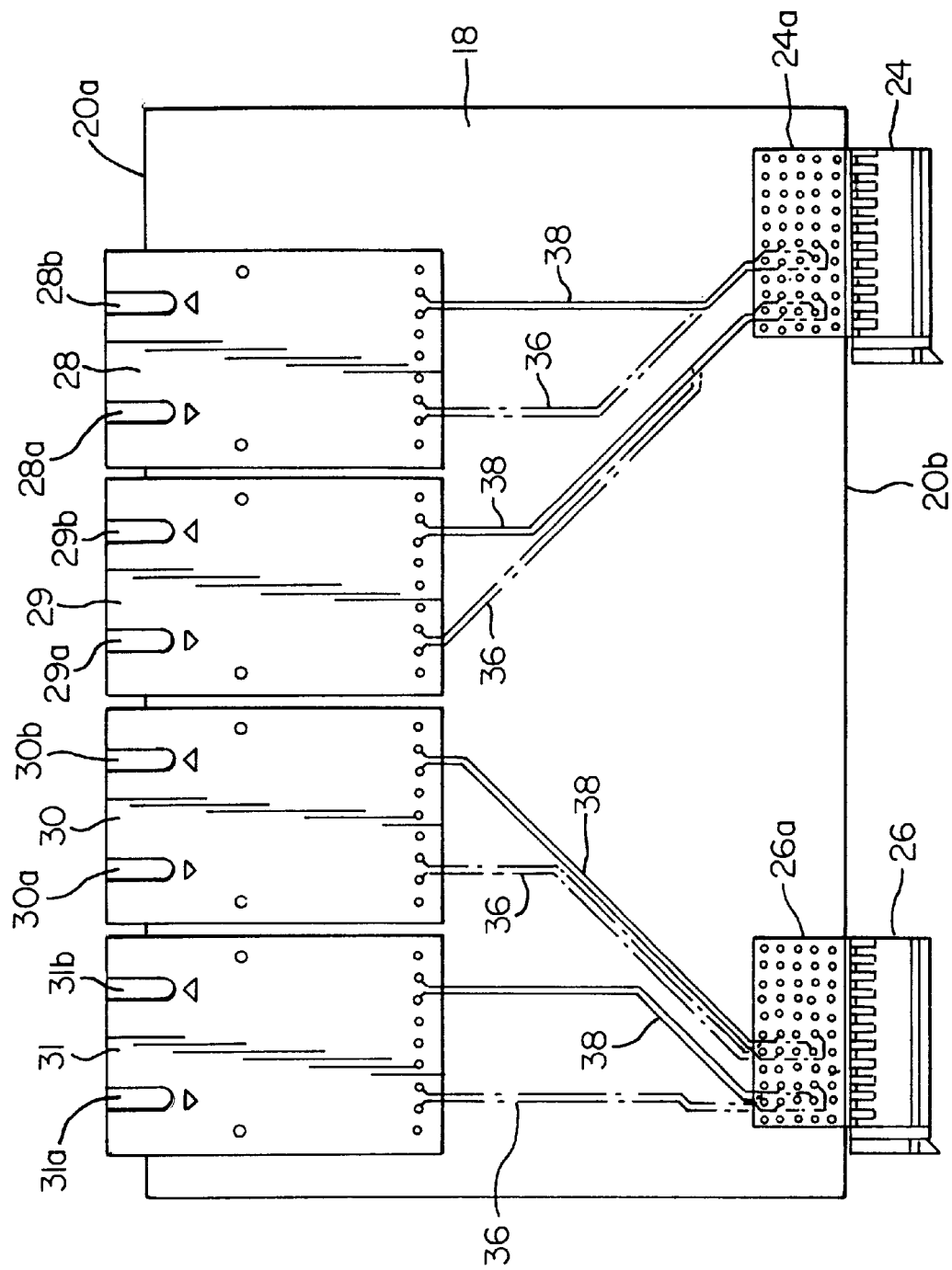
FIG. 3 is a plan view of an interface card of the packaging arrangement of FIG. 1.

Referring to FIG. 3, each of the plurality of interface cards 18 includes a third connector 24, a fourth connector 26, a first input/output (I/O) port 28, a second I/O port 29, a third I/O port 30 and a fourth I/O port 31. The I/O ports 28–31 are disposed along a first end 18a of each interface card 18 while the third and fourth connectors 24, 26 are disposed along a second end 18b of each interface card 18. The third and fourth connectors 24, 26 are illustrated as being female portions of standard connector pairs and include appropriate sockets (not shown) which receive the pins 22 of the first and second connectors 14, 16 when the third and fourth connectors 24, 26 are connected to the first and second connectors 14, 16, respectively.

The third and fourth connectors 24, 26 are separated from one another by the same predetermined distance as the first and second connectors 14, 16 so that the first and second connectors 14, 16 may properly receive and engage corresponding third and fourth connectors 24, 26 when one of the plurality of interface cards 18 is mounted on the backplane 12. It will be appreciated by those skilled in the art that either additional or fewer I/O ports may be provided on each of the interface cards 18.

Equipment processing high speed signals is connected to the I/O ports 28–31 so that the high speed signals can be appropriately switched through the switching subsystem 20 to provide required interconnections for the high speed signals. It will be appreciated by those skilled in the art that the I/O ports 28–31 may be connected to mass storage systems, video distribution systems or the like which utilize the high speed switch for their operation.

Each I/O port 28–31 includes an input connection 28a, 29a, 30a, 31a for receiving signals from the connected equipment and an output connection 28b, 29b, 30b, 31b for transmitting signals to the connected equipment. The first and second I/O ports 28, 29 are connected to the third connector 24 while the third and fourth I/O ports 30, 31 are connected to the fourth connector 26. The I/O ports 28–31 are preferably connected to the third and fourth connectors 24, 26 through a plurality of input PCE traces 36 and a plurality of output PCB traces 38 on the interface cards 18. The input and output PCB traces 36, 38 are illustrated as each being a pair of traces for receiving and transmitting data signals; however, the I/O ports 28–31 may be connected to the third and fourth connectors 24, 26 using single traces or other connection means, such as hardwiring.

The input and output PCB traces 36, 38 are connected between connection pins 40 on the I/O ports 28–31 and connection panels 24a, 26a of the third and fourth connectors 24, 26 which connect the traces 36, 38 on the interface card 18 to respective sockets of the third and fourth connectors 24, 26. Attenuation, distortion and cross-talk are reduced by making the traces 36, 38 as short as possible and by routing the traces 36, 38 so that traces from one I/O port which cross traces from any other I/O port are reduced to a minimum, preferably to zero. Consequently, the first and second I/O ports 28, 29 are routed to the closest connector, i.e. the third connector 24, and the third and fourth I/O ports 30, 31 are routed to the closest connector, i.e. the fourth connector 26.

Only input and output traces have been shown on the accompanying figures for clarity and simplicity. However, it will be appreciated by those skilled in the art that other traces and electrical components may be used both on the backplane 12 and each or any of the port or interface cards 18 for line termination, impedance matching, grounding, signal conditioning and other requirements of the high speed switch packaging arrangement 10. It is apparent that the connectors 14, 16, 24, 26 are not pin limited by the required connections so that the unused pins may also be used for some or all of the aforementioned purposes in the present invention. Furthermore, the particular arrangement of I/O ports 28–31 and connectors increase the available number of pins for other uses. Alternately, connectors having fewer pins can be used. It is to be understood that the I/O ports 28–31 may be adapted to receive and transmit data signals using a variety of different technologies. For example, the signals may be transmitting using unshielded twisted pair conductors, shielded twisted pair cables, fiber optic cables and coaxial cables as well as other signal transmission means. It is to be further understood that one or more of the above technologies may be used by different ones of the I/O ports 28–31 in the present invention.

As shown in FIG. 2, the switching subsystem 20 is positioned between the first and second connectors 14, 16, and preferably, generally centered between the first, second, third, and fourth ends 12a–12d of the backplane 12. For ease of illustration, the switching subsystem 20 is shown as being mounted on the first side 12e of backplane 12 and comprises a single integrated circuit chip 44 having first and second sides 44a, 44b opposing one another and third and fourth sides 44c, 44d opposing one another. Of course, the switching subsystem 20 can also be mounted on the second side 12f of the backplane 12 and such mounting is used in a working embodiment of the high speed switch packaging arrangement 10 and is currently preferred. The integrated circuit chip 44 includes a plurality of connection pins 46 disposed along its first, second, third, and fourth sides 44a–44d, respectively. In the illustrated embodiment, the connection pins 46 include a plurality of input connection pins 46a disposed along the third and fourth sides 44c, 44d of integrated circuit chip 44 for receiving data signals and a plurality of output connection pins 46b disposed along the first and second sides 44a, 44b of integrated circuit chip 44 for transmitting data signals.

A plurality of electrical connections 48, PCB traces as illustrated, are disposed on the backplane 12 for connecting the integrated circuit chip 44 with the first and second connectors 14, 16. The plurality of electrical connections 48 include a plurality of input connection traces 48a and a plurality of output connection traces 48b. As with the input and output traces 36, 38 on the interface cards 18, input and output connection traces 48a, 48b each include a pair of traces for receiving and transmitting signals. The input and output connection traces 48a, 48b are routed to the pins 22 of the first and second connectors 14, 16 so that input connection traces 48a correspond to the input traces 36 coupled to the third and fourth connectors 24, 26 and the output connection traces 48b correspond to the output traces 38 coupled to the third and fourth connectors 24, 26.

The output connection traces 48b coupled to the first connectors 14 are connected to the output connection pins 46b on the first side 44a of integrated circuit chip 44. The output connection traces 48b coupled to the second connectors 16 are connected to the output connection pins 46b on the second side 44b of the integrated circuit chip 44. The input connection traces 48a from the first connectors 14 are connected to the input connection pins 46a on a first portion 44e of the third and fourth sides 44c, 44d of the integrated circuit chip 44. The input connection traces 48a from the second connectors 14 are connected to the input connection pins 46a on a second portion 44f of the third and fourth sides 44c, 44d of the integrated circuit chip 44. As shown in FIG. 2, the first portion 44e of the third and fourth sides 44c, 44d is the upper portion of the integrated circuit chip 44 nearest the first connectors 14. Similarly, the second portion 44f of the third and fourth sides 44c, 44d is the lower portion of the integrated circuit chip 44 nearest the second connectors 16.

The input and output connection traces 48a, 48b are arranged so that input connection traces from each connector which cross input connection traces from the other connectors are reduced to a minimum, preferably to zero, and output connection traces from each connector which cross output connection traces from the other connectors are reduced to a minimum, preferably to zero. Such an arrangement allows for shorter traces which reduces the attenuation and distortion of the signals connected by the traces. Further, cross-talk is reduced by reducing the number of traces which cross one another. Furthermore, shorter traces also reduce cross-talk by reducing the length of parallel traces and hence the coupling between traces. Where traces are parallel to one another, signals from one trace are more likely to be coupled to another trace due to capacitive and inductive coupling which increases with increasing path length.

The input connection traces 48a which cross the output connection traces 48b are crossed using standard multilayer PCB technology. As with the interface cards 18, only input and output traces have been shown on the accompanying figures for clarity and simplicity. However, it will be appreciated by those skilled in the art that other traces and electrical components may be used for line termination, impedance matching, grounding, signal conditioning, other support circuitry and other requirements of the high speed switch packaging arrangement 10.

In the preferred embodiment of the present invention, the integrated circuit chip 44 is a 32 channel integrated circuit switch. There are eight pairs of first and second connectors 14, 16 which interface with eight interface cards 18. The eight interface cards 18 are coupled to 32 I/O ports 28–31 for full 32 channel switching. Further, the present invention allows the interface cards 18 to be positioned over the switching subsystem 20, illustrated as the integrated circuit chip 44. The integrated circuit chip 44 is controlled by a processor (not shown) so that the data signals between the I/O ports 28–31 may be routed as required. The high speed switching arrangement 10 of the present invention increases the number of devices which may be coupled thereto as well as making the arrangement 10 as compact as possible.

It will be appreciated by those skilled in the art that the switching subsystem 20 may include multiple integrated circuits which perform a switching function comparable to the switching function performed by the integrated circuit chip 44. Further, the number of interface cards 18 which are coupled to the backplane 12 is not critical to the invention. The packaging arrangement 10 may be increased by adding additional interface cards 18 and additional switching features from switching subsystem 20. Conversely, the packaging arrangement 10 may use fewer interface cards 18 by not using available interface card slots or manufacturing a backplane with less than 8 slots. Similarly, the number of I/O ports coupled to the interface cards 18 is not critical to the invention. Additional I/O ports may be added to the interface cards 18 to increase the switching capacity of the packaging arrangement 10. Conversely, every I/O port does not have to be used. The interface cards 18 may also be designed with fewer than 4 I/O ports. It should be apparent that the packaging arrangement 10 may be designed to handle any reasonable number of interface cards and I/O ports as long as the electrical paths, crossovers, etc. are as outlined above to ensure the advantages of the present invention.

The plurality of first and second connectors 14, 16 have been shown as being aligned in two parallel rows of connectors. However, it will be appreciated by those skilled in the art that adjacent connectors do not have to be aligned with one another. It is only critical that the spacing between the first and second connectors 14, 16 remain consistent with the spacing of the third and fourth connectors 24, 26. It will be further appreciated by those skilled in the art that the spacing between adjacent pairs of first and second connectors 14, 16 need not be consistent as long as there are corresponding interface cards having similar spacings between the third and fourth connectors 24, 26.

It should be apparent that the switching subsystem 20 should be placed between the first and second connectors 14, 16. Stated another way, the first connectors 14 are positioned on one side of an axis 50 defined by the first side 44a of the integrated circuit chip 44. First connectors 14 are above the axis 50 and first side 44a so that the interconnecting traces are as short as possible. Similarly, the second connectors 16 are positioned on one side of an axis 52 defined by the second side 44b of the integrated circuit chip 44. Second connectors 16 are below the axis 50 and second side 44b so that the interconnecting traces are as short as possible. As shown in FIG. 2, the axes 50, 52 are substantially parallel to the first and second sides 44a, 44b of integrated circuit chip 44. However, it should be apparent that the axes 50, 52 may be at an angle with respect to the first and second sides 44a, 44b if the integrated circuit chip is rotated with respect to the first and second connectors 14, 16. The switching subsystem 20 would still be between the first and second connectors 14, 16 and the first and second connectors would still be on one side of the axes 50, 52.

In the illustrated embodiment of the present invention, the switching subsystem 20, first connectors 14 and second connectors 16 are mounted on the first side 12e of the backplane 12. Single sided placement of the switching subsystem 20 and the connectors 14, 16 reduces manufacturing steps making the backplane easier to produce. Alternately, the switching subsystem 20 can be mounted on the first side 12e of the backplane 12 and the first and second connectors 14, 16 can be mounted on the second side 12f of the backplane 12. These configurations allow the interface cards 18 to be mounted over the switching subsystem 20. The high speed switch arrangement 10 is even more compact since the interface cards 18 may be placed over the switching subsystem 20. The configuration of the backplane with the switching subsystem 20 between the first and second connectors 14, 16 increases the number of ports which may be provided by the switch arrangement 10 while reducing the length of signal traces on the backplane 12 and interface cards 18. The switching arrangement 10 is also easy to maintain and may be upgraded easily. If one of the interface cards 18 fails, the failed card may be simply replaced by removing it from the backplane 12 and installing a new card. The packaging arrangement 10 may be upgraded by simply replacing the switching subsystem 20, for example integrated circuit chip 44 as illustrated, or by installing upgraded port or interface cards. Further, a new backplane utilizing the same circuit arrangement of the current backplane 12 may be used. Changing the backplane in this manner would be transparent to the interface cards 18 such that the interface cards 18 may be reused without any changes. The switching arrangement 10 is compact, versatile, easily upgradable and easily maintained.

Having described the invention of the present application in detail and by reference to preferred embodiments thereof, it will be apparent that modifications and variations are possible without departing from the scope of the invention which is defined in the appended claims.

What is claimed is:

1. A high speed switch packaging arrangement comprising:
    a backplane having first, second, third and fourth ends, said first and second ends being opposite one another and said third and fourth ends being opposite one another;
    a plurality of first connectors disposed along said first end of said backplane;
    a plurality of second connectors disposed along said second end of said backplane and aligned with said first connectors to define corresponding pairs of first and second connectors;
    a switching subsystem disposed between said first connectors and said second connectors on said backplane which provides a plurality of electrical connections between said switching subsystem and said first and second connectors; and
    a plurality of interface cards each having a third connector and a fourth connector with each corresponding pair of said first and second connectors receiving said third and fourth connectors of respective interface cards to connect said interface cards to said backplane.

2. The arrangement of claim 1, wherein said plurality of electrical connections comprise at least one input connection and at least one output connection for each of said plurality of first and second connectors.

3. The arrangement of claim 2, wherein each of said interface cards comprises at least one input/output (I/O) port associated with each of said third and fourth connectors.

4. The arrangement of claim 3, wherein said first connectors and said second connectors are disposed on a first side of said backplane and said switching subsystem is disposed on a second side of said backplane.

5. The arrangement of claim 4, wherein at least one of said interface cards extends over a portion of said backplane including said switching subsystem.

6. The arrangement of claim 1, wherein said plurality of electrical connections comprise a plurality of input connections and a plurality of output connections for each of said plurality of first and second connectors, and wherein each of said interface cards comprises a plurality of I/O ports associated with said third and fourth connectors.

7. The arrangement of claim 6, wherein said plurality of I/O ports comprise a first and second I/O port associated with said third connector and a third and fourth I/O port associated with said fourth connector.

8. The arrangement of claim 6, wherein each of said first, second, third and fourth connectors comprises a plurality of unused connection pins.

9. The arrangement of claim 7, wherein said I/O ports are disposed along first ends of said interface cards and said third and fourth connectors are disposed along second ends of said interface cards, each of said interface cards comprising a plurality of printed circuit board traces disposed on said interface card and connecting each of said I/O ports with a respective one of said third and fourth connectors so that traces from each of said I/O ports which cross traces from other I/O ports are reduced to a minimum.

10. The arrangement of claim 1, wherein said plurality of electrical connections are printed circuit board traces.

11. The arrangement of claim 1, wherein said switching subsystem comprises at least one integrated circuit chip.

12. The arrangement of claim 11, wherein said at least one integrated circuit chip is a 32 channel switching integrated circuit chip, said plurality of first and second connectors form 8 corresponding pairs of connectors, and each of said interface cards comprises 4 I/O ports.

13. A high speed switch packaging arrangement comprising:
    a backplane having a first side, a second side, a first end, and a second end, said backplane comprising a plurality of printed circuit board traces disposed on said backplane;
    a plurality of first connectors disposed along said first end on said first side of said backplane;
    a plurality of second connectors disposed along said second end on said first side of said backplane and aligned with said plurality of first connectors forming corresponding pairs of first and second connectors;
    a switching subsystem disposed on said backplane between said plurality of first and second connectors, said plurality of printed circuit board traces connecting said switching subsystem with said plurality of first and second connectors; and
    a plurality of interface cards each having a third connector and a fourth connector with each corresponding pair of said first and second connectors receiving said third and fourth connectors of respective interface cards to connect said interface cards to said backplane, at least one of said interface cards extending over a portion of said backplane which supports said switching subsystem, and wherein each of said interface cards comprises at least one I/O port associated with said third connector and at least one I/O port associated with said fourth connector.

14. The arrangement of claim 13, wherein said plurality of printed circuit board traces comprise a plurality of input connections and a plurality of output connections for each of said plurality of first and second connectors, and wherein each of said interface cards comprises a first and second I/O port associated with said third connector and a third and fourth I/O port associated with said fourth connector.

15. The arrangement of claim 14, wherein said I/O ports are disposed along a first end of each of said interface cards and said third and fourth connectors are disposed along a second end of each of said interface cards, each of said interface cards comprising a plurality of printed circuit board traces disposed thereon and connecting each of said I/O ports with a respective one of said third and fourth connectors so that traces from each of said I/O ports which cross traces from other I/O ports are reduced to a minimum.

16. The arrangement of claim 15, wherein said switching subsystem includes one integrated circuit chip, said one integrated circuit chip having connection pins disposed along first and second sides opposing one another and third and fourth sides opposing one another, said plurality of output connections including a first plurality of output connections connecting said plurality of first connectors to said connection pins primarily along said first side of said one integrated circuit chip and a second plurality of output connections connecting said plurality of second connectors to said connection pins primarily along said second side of said one integrated circuit chip, said plurality of input connections including a first plurality of input connections connecting said plurality of first connectors to said connection pins along a first portion of said third and fourth sides of said one integrated circuit chip and a second plurality of input connections connecting said plurality of second connectors to connection pins along a second portion of said third and fourth sides of said one integrated circuit chip.

17. The arrangement of claim 16, wherein said first and second plurality of output connections are arranged so that said output connections from each connector which cross output connections from other connectors are reduced to a minimum, and said first and second plurality of input connections are arranged so that said input connections from each connector which cross input connections from other connectors are reduced to a minimum.

18. The arrangement of claim 17, wherein said each of said first, second, third and fourth connectors comprises a plurality of unused connection pins.

19. The arrangement of claim 18, wherein said one integrated circuit chip is a 32 channel switching integrated circuit chip and said plurality of first and second connectors form 8 corresponding pairs of connectors.

20. A high speed switch packaging arrangement comprising:

a backplane having first and second ends opposing one another, third and fourth ends opposing one another, a first side and a second side;

a switching subsystem disposed on said backplane and generally centered between said first, second, third and fourth ends of said backplane;

a plurality of first connectors disposed on said first side of said backplane and on one side of an axis defined by a first side of said switching subsystem;

a plurality of second connectors disposed on said first side of said backplane and on one side of an axis defined by a second side of said switching subsystem, said first and second connectors forming corresponding pairs of first and second connectors;

a plurality of printed circuit board traces on said backplane connecting said switching subsystem with said plurality of first and second connectors; and a plurality of interface cards each having a third connector and a fourth connector with each corresponding pair of said first and second connectors receiving said third and fourth connectors of respective interface cards to connect said interface cards to said backplane, at least one of said interface cards extending over a portion of said backplane including said switching subsystem, and wherein each of said interface cards comprises at least one I/O port associated with said third connector and at least one I/O port associated with said fourth connector.

* * * * *